United States Patent [19]

Fritts

[11] 4,001,684
[45] Jan. 4, 1977

[54] CURRENT MEASURING SHUNT
[76] Inventor: David H. Fritts, 112 Beverly Place, Dayton, Ohio 45419
[22] Filed: Sept. 10, 1975
[21] Appl. No.: 612,069
[52] U.S. Cl. .................................. 324/126; 324/95
[51] Int. Cl.² .................................... G01R 15/00
[58] Field of Search ............ 324/126, 95; 323/94 R

[56]       References Cited
    FOREIGN PATENTS OR APPLICATIONS
1,301,293  12/1972  United Kingdom ............... 324/126

Primary Examiner—Robert Segal
Assistant Examiner—Ernest F. Karlsen
Attorney, Agent, or Firm—Joseph E. Rusz; Robert Kern Duncan

[57]   ABSTRACT

A current shunt, for measuring rapidly changing values of current, providing a voltage indicative of the current wave that is free of any inductive effects of the shunt is provided by forming the shunt from two dimensionally identical elements but each having a different electrical resistivity and adding the voltage drops across the elements. The elements have equal and cancelling induced electrical voltages leaving an electrical voltage free of inductive effects and that is proportional to the current flowing through the shunt.

2 Claims, 11 Drawing Figures

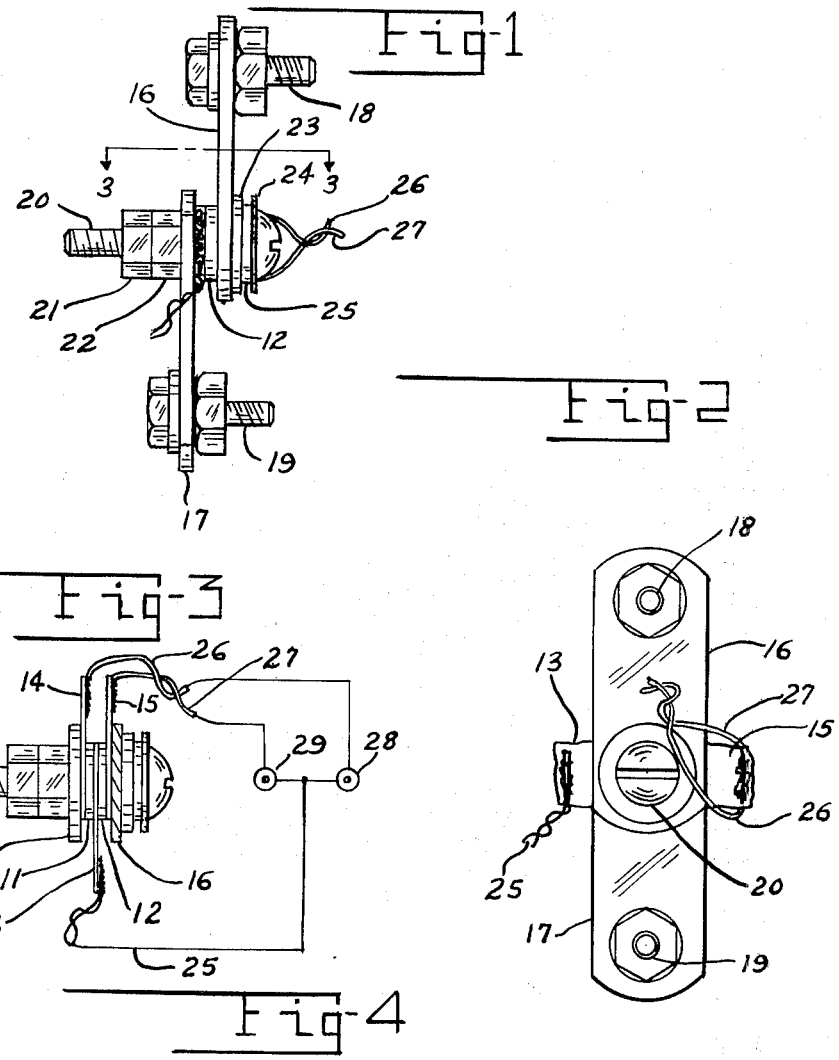
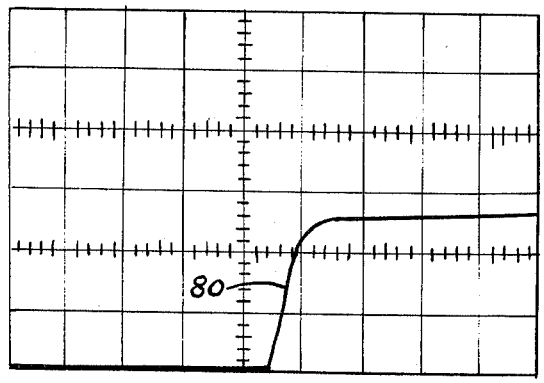

CURRENT MEASURING SHUNT

RIGHTS OF THE GOVERNMENT

The invention described herein may be manufactured and used by or for the Government of the United States for all governmental purposes without the payment of any royalty.

BACKGROUND OF THE INVENTION

The field of the invention is in the electrical current measuring art. Electrical shunts for current measurement in which the voltage across the shunt is proportional to the current flowing through the shunt are very widely used and have been known for many years. The conventional shunt is a low resistive device, so as to minimally affect the circuit being measured. A short, large cross section, constantan strap is a typical embodiment of a prior art shunt. With the advent of high current pulsed circuits such as are used in radar and other high frequency devices, it has become desirable to measure the rise characteristics of large current pulses and also the wave shape of short duration pulses. The conventional strap shunt while entirely suitable for steady state current measurements, inherently has some inductance, even though very small. The inductance while generally of such a low value that its effect on the operating equipment being measured is negligible, the inductance is not negligible to the measuring equipment. An inductance spike or ringing characteristic appears in the measuring equipment that may mask rapidly changing current characteristics of the operating equipment. Thus, the measurement obtained is of questionable value as to its being truly representative of the current flowing to the operating equipment.

Non-inductive resistors are well known. They are frequently fabricated by forming the resistance wire into a hairpin loop then winding the wire on a form. A resistance value relatively free of inductive effects is obtained. However, these devices are resistors having appreciable resistance. A current measuring shunt should have a very, very low resistance so as to not alter the operating equipment. Thus, the conventional non-inductive resistor techniques are entirely unsuitable for current measuring shunts.

SUMMARY OF THE INVENTION

A current measuring shunt substantially devoid of inductance effects is provided for measuring current changes that occur over time intervals from approximately one microsecond up to steady state currents.

BRIEF DESCRIPTION OF THE DRAWING

FIG. 1 is a side view of a typical embodiment of the invention;

FIG. 2 is a front view of the embodiment shown in FIG. 1;

FIG. 3 is a section view of the embodiment shown in FIG. 1;

FIG. 4 is a drawing taken from the face of a cathode ray oscilloscope showing a typical calibration curve of an embodiment of the invention;

DESCRIPTION OF THE PREFERRED EMBODIMENT

Figure 5:
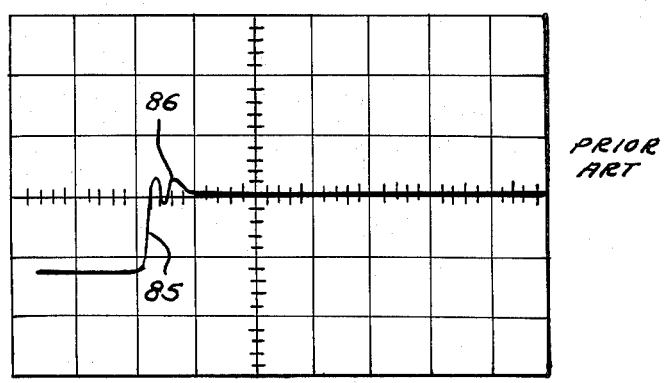
FIG. 5 is a drawing taken from the face of a cathode ray oscilloscope showing the voltage trace of a typical prior art current measuring shunt.

The generally preferred embodiment of the invention for usage with moderate to large currents is illustrated in FIGS. 1, 2 and 3. The voltage producing elements of the shunt are the physically identical brass washer 11 and the carbon washer 12. Connection to the juncture between the brass washer 11 and the carbon washer 12 is made through the copper shim 13. Voltage sensing at the outer extremity of the brass washer is made through the copper shim 14. Copper shim 15 provides the voltage sensing contact of the outer end of the carbon washer. Current carrying members 16 and 17 with screw connections 18 and 19 provide for inserting the shunt in the current carrying conductor in which it is desired to measure the current. Solder lugs on the ends of the conductors over bolts 18 and 19 held by another nut on each is typical. The assembly is conventionally held together by nylon bolt 20 and nylon nuts 21 and 22. The whole assembly may be mounted on an insulating board or other surface by the bolt 20 passing through a hole in the board and secured by an additional nut. Conventional flat washers 23 and 24 with lock washer 25, aid in forming the assembly and the clamping of the shunt elements in a conventional manner. Current carrying conductor straps 16 and 17 are typically fabricated from nickel plated copper. Depending upon the particular application of the invention these straps may be fabricated from any suitable conductors such as silver, brass, or gold.

The current to be measured flows either into terminal 18 or 19, and out of the other. Voltage leads 25, 26, and 27 are soldered to the respective copper shims 13, 14, and 15. It is generally preferred that extensions of the voltage carrying leads 25, 26, and 27 be made to the indicating instrument, such as an oscilloscope, through shielded cable. Thus, it is typical to mount a pair of coax connectors 28 and 29, such as type BNC, on the board in which the shunt is mounted and connect the center common contact lead 25 to the coax shields. The shields may be connected to the instrumentation ground in those situations where there is no conflict with other grounds in the system in which the current is being measured. In most instances it will be preferable to have the shields floating so as not to have a conflicting ground situation. These techniques are well known and are common practice in the instrumentation art.

Figure 7:
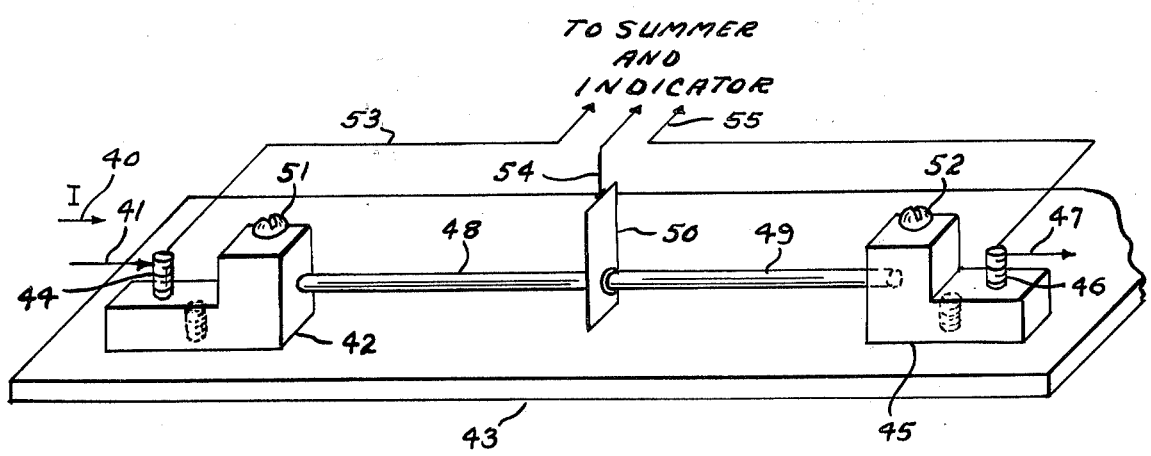
FIG. 7 illustrates pictorially another embodiment of the invention.

FIG. 7 illustrates another embodiment of the invention that is generally better suited for lower currents and less sensitive indicating instruments than the previously described embodiment. The current to be measured I, 40, flows from a conductive wire 41 into the conductive block 42 mounted on insulating board 43 via the terminal 44, and out of conductive block 45 via terminal 46 into attached conductive wire 47 connecting with the circuit to be measured. The active elements of the shunt producing a voltage for readout are conductors 48 and 49. They are identical physically, i.e., the same effective lengths between end blocks 42 and 45 and the center electrical voltage contact juncture shim 50, and of the same diameter. Typically, blocks 42 and 45 providing both current and voltage contacts are fabricated from brass or plated copper. The voltage producing elements 48 and 49 are typically soldered to the brass shim 50 and clamped in the end blocks by screws 51 and 52. The elements 48 and 49 must have different resistances. Since they are identical physically they are fabricated from different materials. Suitable materials are copper for one element and constantan for the other. Silver-aluminum is also a suitable combination. It is readily understood that the nearer the resistances of the two elements are to being the same value the more sensitive the indicating equipment must be.

The operation of this novel shunt may best be understood from considering the operation of the embodiment represented in FIG. 7. The current 40 is represented by I, the voltage across element 48 appearing on conductors 53 to 54 as $V_1$ and the voltage across element 49 on conductors 54 and 55 as $V_2$. The resistance and inductance of element 48 as $R_1$ and $L_1$, respectively, and of element 49 as $R_2$ and $L_2$. When the voltages across elements 48 and 49 are summed with respect to the common juncture 50, one will be plus and the other minus. This is apparent by considering the connecting one probe of a volt meter to the center shim 50, then if the other probe gives a positive reading when it is touched to block 42 (or conductor 53) then it will read backward indicating a negative reading when connected with block 45 or conductor 55. The same situation exists concerning the inductances of elements 48 and 49. Summing about the common connection gives the following expressions for the instantaneous value of current i.

$$V_1 = iR_1 + L_1 \frac{di}{dt}$$

$$V_2 = -iR_2 - L_2 \frac{di}{dt}$$

adding $V_1$ and $V_2$ gives, $$V_1 + V_2 = (R_1 - R_2) i + (L_1 - L_2) \frac{di}{dt}$$

The inductive term $(L_1-L_2)$ was made equal to zero when the two elements were constructed identical since the inductance is a function of geometry and environment. Thus, $V_1 + V_2 = (R_1-R_2)i$, and the summation of the voltages provides a voltage that is a true representation of the current flowing without any disturbances due to inductive effects. Dimensionally and environmentally, the elements must be substantially equal. Thus, for measuring high frequency currents the wire segments 48 and 49 should be much less than a wavelength of the frequency of the current being measured. Generally, less than approximately one-tenth wavelength is suitable.

Figure 8:
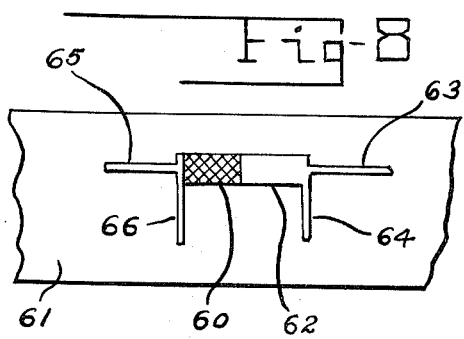
FIG. 8 illustrates pictorially a "printed circuit" type embodiment of the invention.
Figure 9:
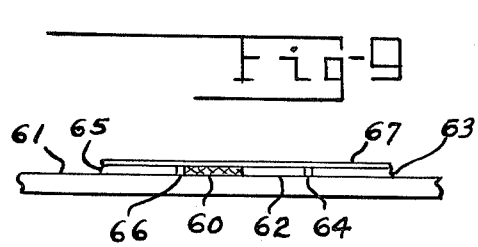
FIG. 9 is an elevation view of the embodiment shown in FIG. 8.

FIGS. 8 and 9 show a representative fabrication of an embodiment of the invention on a printed circuit board. A carbon element 60 is deposited on the substrate insulating board 61 having conventional copper cladding forming the other shunt element 62 and the conductive leads 63 through 66. If it is desired to adjust the resistive temperature coefficient of the carbon, boron may be added to it in the conventional manner. The whole shunt assembly is conventionally covered with insulating varnish 67 for protection. In this embodiment, as in the previously described embodiments, the lengths, widths, and thicknesses of the elements 60 and 62 forming the shunt, must be made substantially equal so that their inductances will be substantially equal.

Figure 10:
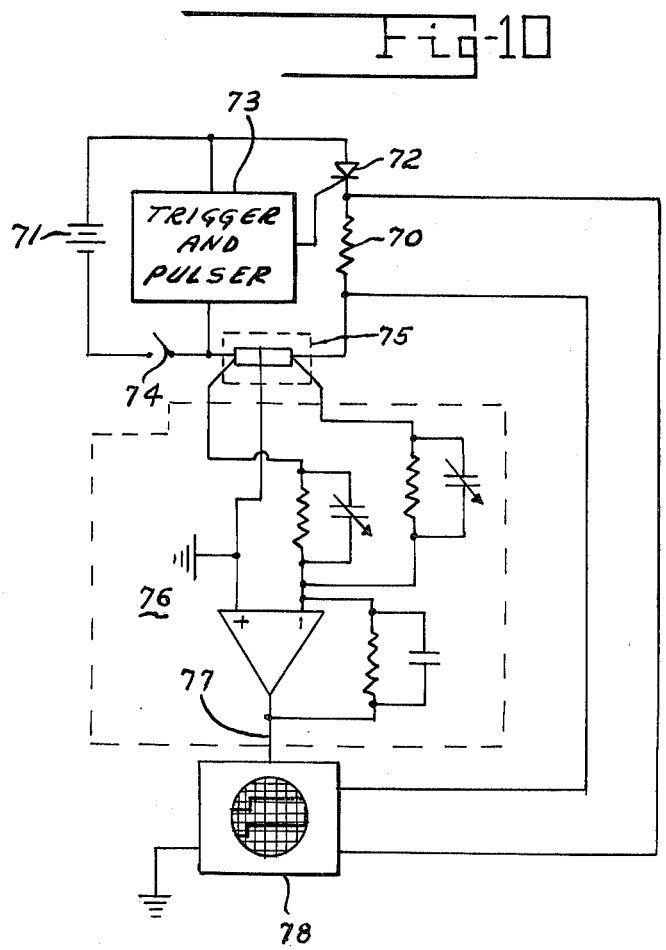
FIG. 10 is a schematic diagram showing a typical calibration circuit.

Embodiments of the invention may be calibrated in any of the conventional ways shunts are calibrated. For example, the calibration may be made with steady state values of currents using a known value of voltage and load resistor. Another conventional calibration by comparison technique is illustrated in FIG. 10. This calibration method offers the advantage of being able to observe the current rise characteristic in an oscilloscope. A conventional non-inductive load resistor 70 is switched across a potential source 71 by the silicon controlled rectifier 72 and its controlling circuitry 73. (Switch 74, obviously, is closed before starting the calibration.) The current flowing through the load flows through a shunt 75, fabricated as taught herein. Conventional adder 76 sums the voltages from the shunt and provides an output voltage with respect to ground on line 77 proportional to the summation voltage. The output voltage from the adder 76 and the voltage across the calibrating load resistor 70 may be conventionally displayed on a voltage calibrated dual beam oscilloscope 78. Knowing the value of the calibrating resistor and the deflection sensitivity of the oscilloscope the calibration characteristic of shunt 75 and its associated summing amplifier 76 is readily determined in terms of output volts per ampere of current flowing in the calibration circuit. The calibration characteristic of the shunt 75 may be expressed directly in terms of a summation voltage output from the shunt per ampere of current flowing through the shunt, knowing the amplification characteristics of the summing amplifier.

FIG. 4 is a plot 80 of a calibration trace taken from an oscilloscope of an embodiment of the invention as illustrated in FIGS. 1, 2, and 3. The load resistor was a 2.1 ohm precision noninductive resistor. The display characteristics of the oscilloscope were five volts per centimeter vertical deflection and the sweep used was ten microseconds per centimeter. The direct summation voltage calibration of the shunt was approximately 63 millivolts per ampere. The elements of the shunt 11, and 12 (FIGS. 1, 2 and 3) were fabricated from brass and carbon. The carbon electrodes used in arc lamps is a suitable type of carbon from which to fabricate the carbon element. This particular shunt had elements 11 and 12 having outside diameters of approximately 9/16 inch, inside diameters of approximately ¼ inch, and thicknesses of approximately 1/10 inch. It is considered suitable for steady state currents in the low ampere range (under 10), depending upon the cooling, i.e., airflow over it. It is suitable for short duration, low duty cycle current pulses up to approximately 600 amperes.

Figure 6:
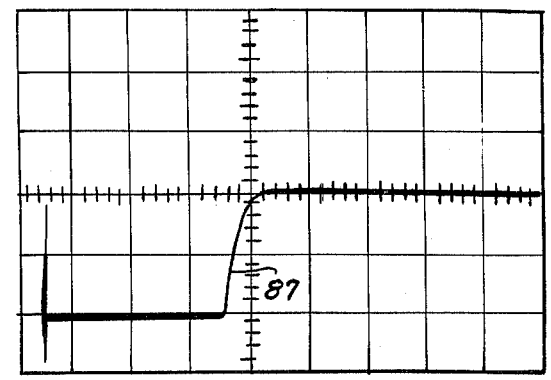
FIG. 6 is a drawing taken from the trace of a cathode ray oscilloscope showing the true voltage rise characteristic using an embodiment of the invention.

The curve 85 in FIG. 5 is a plot from an oscilloscope trace of the current rise in a particular substantially non-inductive circuit using a conventional constantan shunt. Note the ringing characteristic 86. The curve 87 in FIG. 6 is a plot from an oscilloscope trace of the current rise in the same circuit using a shunt fabricated as taught herein. Note that the ringing 86 of FIG. 5 was created by the inductance in the conventional shunt and was not a characteristic of the circuit being measured since it does not appear when using an embodiment of a shunt of this invention. The deflection sweep speeds are the same for both FIGS. 5 and 6 and are approximately 10 μsec/cm.

As previously indicated it is desirable that the environment of both elements of the shunt be substantially the same. Thus, care must be exercised that no current return paths (leads) be measurably more actuating on one element of the shunt than the other, and destroy the inductive balance of the shunt. Likewise, the shunt should not be placed in proximity to magnetic material in such a manner as to unbalance the inductive characteristics of the shunt. If the shunt is operated with magnitudes of current so as to cause appreciable heating of the elements of the shunt any changes in resistance of the elements that would cause a change in the calibration must be taken into consideration. Generally the design of the elements is such that the temperature rise in the elements due to the $I^2R$ losses is substantially negligible. This is easily done by using relatively large elements so that the current densities are relatively low, and radiating areas are large. Generally, it is desirable to fabricate the elements of the shunt from non-magnetic materials to prevent stray unbalanced magnetic couplings. In measuring high frequency currents it is desirable to make the dimensions of the shunt a small fraction of the wavelength involved or if this is not feasible then the lengths of the elements of the shunt must be adjusted so that the individual inductances at that particular frequency are the same.

Figure 11:
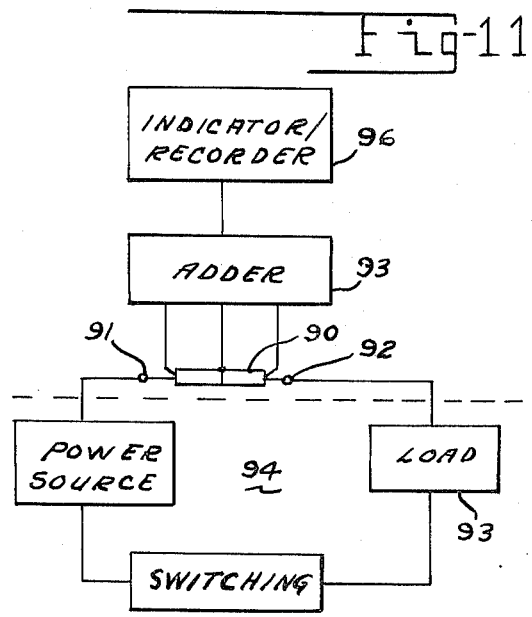
FIG. 11 is a representative schematic block diagram showing a typical operational circuit utilizing an embodiment of the invention.

FIG. 11 illustrates in block diagram form a current measuring (or examining) setup showing typical connections to a symbolic embodiment of the invention. The shunt 90 is inserted into a current carrying conductor of the load 93 of the external system 94 at points 91 and 92. The adder 95 sums the two voltages from the shunt element and provides an output that may be read on an indicator as a value of current or it may be displayed on an oscilloscope so that the changing characteristics of the current wave may be visually observed, or it may be recorded either as a numerical value or as a plotted curve. These recording and indicating techniques are well known in the art and the particular instrument 96 will be selected accordingly. The only instrumentation requirement for cooperation with the shunt is a conventional voltage adder that provides an output proportional to the sum of the two voltages and that has sensitivities and response times compatible with the measurements being made.

I claim:

1. An inductively balanced shunt for measuring high frequency currents having a determined wavelength, comprising:
   a. a first flat washer-shaped, non-magnetic, electrically conductive element having determined dimensions of outside diameter, inside diameter, and thickness. The magnitude of each of the said determined dimensions being less than approximately one-tenth the said wavelength, and the said washer having a determined first thickness resistance;
   b. a second flat washer-shaped, non-magnetic, electrically conductive element having a determined outside diameter, a determined inside diameter, and a determined thickness, respectively, substantially the same as those of the said first washer-shaped element, and a determined second thickness resistance different in value from the said first thickness resistance;
   c. means for axially aligning the said first and second washer-shaped elements, serially connecting the said first thickness resistance and the said second thickness resistance, and providing an electrical voltage connection contact at the said juncture; and
   d. means for providing a current and a voltage contact to each of the said washer-shaped elements opposite the said juncture.

2. The shunt as claimed in claim 1 wherein the said first non-magnetic washer-shaped element is fabricated from brass material, and the said second non-magnetic washer-shaped element is fabricated from carbon material.

* * * * *